United States Patent [19]
Chambers et al.

[11] Patent Number: 5,901,347
[45] Date of Patent: May 4, 1999

[54] FAST AUTOMATIC GAIN CONTROL CIRCUIT AND METHOD FOR ZERO INTERMEDIATE FREQUENCY RECEIVERS AND RADIOTELEPHONE USING SAME

[75] Inventors: Mark J. Chambers, Gilbert, Ariz.; Jaime A. Borras, Miami, Fla.; S. Hossein Beladi, Southlake, Tex.

[73] Assignee: Motorola, Inc., Schaumburg, Ill.

[21] Appl. No.: 08/587,619

[22] Filed: Jan. 17, 1996

[51] Int. Cl.[6] .................................................. H03G 3/00
[52] U.S. Cl. .................................... 455/234.1; 455/240.1; 455/249.1; 330/134
[58] Field of Search .............................. 455/232.1, 234.1, 455/234.2, 249.1, 250.1, 251.1, 253.2, 254, 240.1; 375/345; 330/134, 138, 279, 280

[56] References Cited

U.S. PATENT DOCUMENTS

| | | | |
|---|---|---|---|
| 4,301,445 | 11/1981 | Robinson | 455/249.1 |
| 4,514,703 | 4/1985 | Maher et al. | 330/279 |
| 4,570,127 | 2/1986 | Tanimoto et al. | 330/137 |
| 4,653,117 | 3/1987 | Heck | 455/209 |
| 5,212,827 | 5/1993 | Meszko et al. | 455/219 |
| 5,222,253 | 6/1993 | Heck | 455/78 |
| 5,507,023 | 4/1996 | Suganuma et al. | 455/234.1 |
| 5,548,833 | 8/1996 | Townsend | 455/234.1 |

*Primary Examiner*—Edward F. Urban
*Assistant Examiner*—Lee Nguyen
*Attorney, Agent, or Firm*—John G. Rauch

[57] ABSTRACT

A method and apparatus provides control of the gain of an input amplifier (306) in a radio receiver (300), such as in a radiotelephone handset (104). The radio receiver (300) includes an automatic gain control circuit (318). The automatic gain control circuit (318) includes a timer circuit (370) which provides asynchronous, digital automatic gain control circuit to perform a coarse gain adjustment. The automatic gain control circuit (318) further includes an integrator (366) which provides analog automatic gain control for providing remaining needed gain regulation. The automatic gain control circuit (318) provides substantial reduction in input signal acquisition time for the radio receiver (300).

17 Claims, 3 Drawing Sheets

FAST AUTOMATIC GAIN CONTROL CIRCUIT AND METHOD FOR ZERO INTERMEDIATE FREQUENCY RECEIVERS AND RADIOTELEPHONE USING SAME

FIELD OF THE INVENTION

The present invention generally relates to radio receivers. The present invention relates more specifically to a method and apparatus for automatic gain control in a zero intermediate frequency radio receiver.

BACKGROUND OF THE INVENTION

Many radio systems employ a zero intermediate frequency (zero IF or ZIF) receiver for receiving radio frequency (RF) and intermediate frequency (IF) signals. Such receivers are also known as homodyne receivers. Such receivers translate the signal spectrum of received signals from a spectrum about a modulating carrier frequency directly to substantially 0 Hz (i.e. DC or baseband) for demodulation.

Zero IF or ZIF receivers have the advantage that they may be readily implemented in monolithic silicon integrated circuits. Such receivers do not require complicated high frequency bandpass filters. Rather, such receivers employ relatively low frequency, low pass filters which reject unwanted signal frequencies (i.e., unwanted channels), passing only the in-phase (I) and quadrature phase (Q) components of the desired radio channel. These filters can be integrated on-chip with other components of the receiver to reduce the size and cost of the receiver and the radio. ZIF receivers may also be advantageously used in consumer products, such as radiotelephone handsets for cellular and cordless radiotelephone systems, which are sensitive to cost and physical size. Moreover, ZIF receivers generally require relatively low operating power, making them ideal for battery-powered products such as radiotelephone handsets.

A disadvantage of ZIF receivers is that the input signal level must be kept within the linear operating range of the low pass filters included in the receiver. These filters generally operate in one of three modes. In cut off mode, the input signal level is too small to produce a meaningful response from the filter. In saturation, the input signal level is so large that the filter output is clipped or otherwise distorted. In the linear range of operation, input signal level is appropriate for proper filter operation.

To insure that the input signal level remains within the linear operating range of the low pass filters, ZIF receivers have included an automatic gain control (AGC) circuit. The AGC circuit regulates the gain of an input amplifier in response to the detected signal level of the received signals. In this manner, the AGC circuit keeps the input signal level within the linear operating range of the receiver filters.

A significant limitation of prior art AGC circuits is the speed with which the AGC circuit can respond to detected signals. In a typical situation, when the radio is operating in listening mode, awaiting receipt of RF signals, the receiver must scan all defined channels searching for incoming RF signals. Because a transmitter may be near or far and because channel noise is indeterminate, the receiver has no advance information of incoming signal strength or level. To detect weak signals, the receiver sets the gain of the input amplifier high, using the AGC circuit. If, instead of weak signals, the receiver detects, moderate or strong signals, the gain is automatically adjusted to accommodate the detected signal.

The necessary gain adjustment by the AGC circuit takes time, known as the acquisition time. The required time is a function of the IF modulation bandwidth of the receiver, which cannot be varied to improve performance of the receiver. During the acquisition time, when a receiver is adjusting AGC gain, the incoming signal is not being accurately detected and demodulated by the receiver. Therefore, a portion of the signal is lost, while the receiver detects the signal. Also, because the receiver is energized during this acquisition, the receiver is depleting energy from batteries which are used to power the radio.

These problems are exacerbated in a receiver operating according to a time division multiple access (TDMA) protocol. In a TDMA system, the receiver receives bursts of data during assigned time slots. At the start of each time slot, the receiver must determine appropriate gain for the input amplifier. If the receiver's automatic gain control circuit responds slowly, performance of the receiver is degraded.

Accordingly, there is a need in the art for an automatic gain control circuit which improves acquisition time for radio receivers.

BRIEF DESCRIPTION OF THE DRAWINGS

The features of the present invention which are believed to be novel are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF THE PREFERRED EMBODIMENTS

Figure 1:
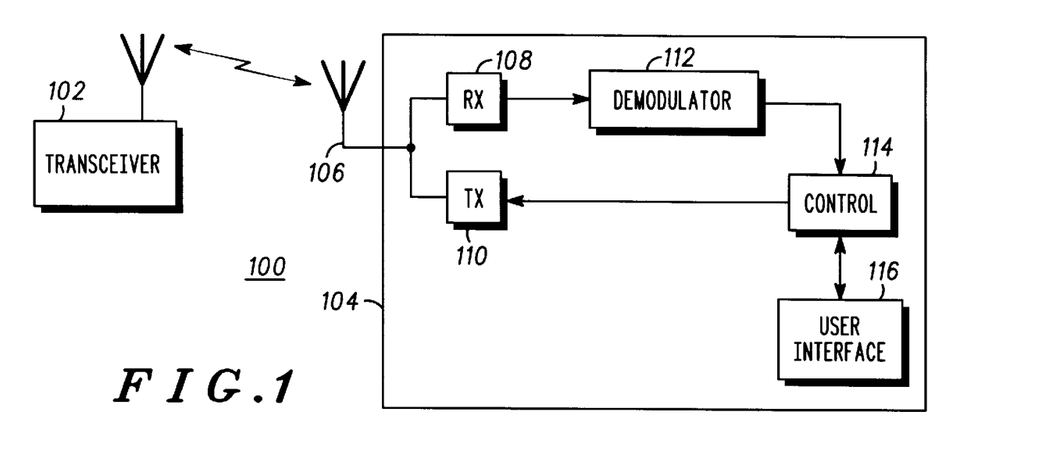
FIG. 1 is an illustration in block diagram form of a radio telecommunications system which may employ the present invention.

FIG. 1 is an illustration in block diagram form of a radiotelephone communication system 100. The radiotelephone communication system 100 includes a remote transceiver 102 and one or more radiotelephone handsets such as radiotelephone handset 104. The remote transceiver 102 sends and receives radio frequency (RF) signals to and from radiotelephone handsets within a fixed geographic area.

The radiotelephone handset 104 is one such radiotelephone handset contained within the geographic area. The radiotelephone handset 104 includes an antenna 106, a receiver 108, a transmitter 110, a demodulator 112, a controller 114 and a user interface 116. Upon reception of RF signals, the radiotelephone handset 104 detects the RF signals through the antenna. 106 producing detected RF signals. The receiver 108, coupled to the antenna 106, converts the detected RF signals into electrical baseband signals. The demodulator 112 demodulates the electrical baseband signals and recovers the data transmitted on the RF signals and outputs the data to the controller 114. The controller 114 formats the data into recognizable voice or information for use by user interface 116. The user interface 116 communicates the received information or voice to a user. Typically, the user interface 116 includes a display, a keypad, a speaker and a microphone (not shown).

Upon transmission of radio frequency signals from the radiotelephone handset 104 to the remote transceiver 102, the user interface 116 transmits user input data to the controller 114. The controller 114 typically includes a microprocessor, memory, clock generator and a power amplifier control circuit (not shown). The controller 114 formats the information obtained from the user interface 116 and conveys it to the transmitter 110 for conversion into RF modulated signals. The transmitter 110 conveys the RF modulated signals to the antenna 106 for transmission to the remote transceiver 102.

Figure 2:
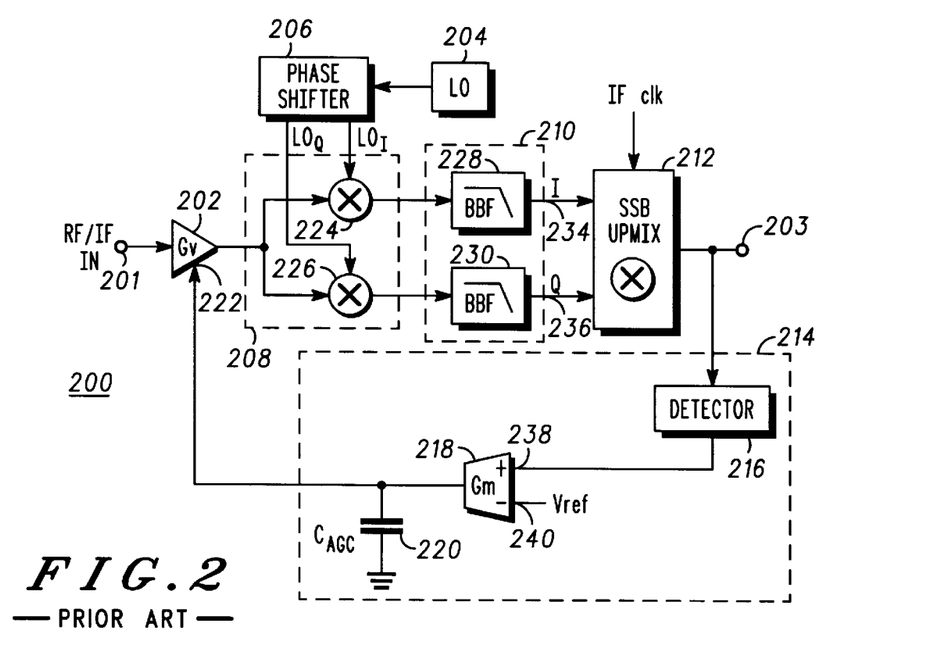
FIG. 2 is an illustration in block diagram form of a prior art radio receiver.

Referring now to FIG. 2, it shows an illustration in block diagram form of a prior art radio receiver 200. The receiver 200 includes an input amplifier 202, a local oscillator 204, a phase shifter 206, a first mixer circuit 208, a filter circuit 210, a single sideband mixer 212 and an automatic gain control circuit 214. The receiver 200 has a receiver input 201 and a receiver output 203.

The input amplifier 202 has, a gain control input 222 for receiving a gain control signal from the automatic gain control circuit 214. The input amplifier 202 is coupled to the receiver input 201 and amplifies the signals in response to the gain control signal received at the gain control input 222. The input amplifier 202 amplifies the amplitude of the analog, RF signals received from the receiver input 201. The input amplifier 202 provides the amplified signals to the first mixer circuit 208.

The first mixer circuit 208 includes a first mixer 224 and a second mixer 226. In a manner well-known in the art, the first mixer 224 and the second mixer 226 down convert the received RF signals to baseband frequency signals. Toward this end, the first mixer circuit 208 receives from the phase shifter 206 in-phase and quadrature signals. The phase shifter receives a local oscillator signal from the local oscillator 204. The local oscillator signal is tuned to a predefined channel frequency. In response to the local oscillator signal, the phase shifter provides the local oscillator in-phase signal and the local oscillator quadrature signal which is 90° out of phase from the local oscillator in-phase signal.

The filter circuit 210 includes a first filter 228 and a second filter 230. The first filter 228 and the second filter 230 are both lowpass, baseband filters (BBF) as is indicated in FIG. 2. Each filter respectively filters a signal received from the first mixer circuit 208 to provide an in-phase signal on a first output 234 and a quadrature output on a second output 236.

The single sideband mixer 212 receives the in-phase and quadrature signals which modulate the on-channel in-phase and quadrature signals up to a moderate IF frequency (for example, 1 MHz) for IF demodulation. The modulated signal is provided to the receiver output 203 and conveyed to the demodulator 112 (FIG. 1) for demodulation. In addition, the modulated signal is provided to the automatic gain control circuit 214.

The automatic gain control (AGC) circuit 214 includes a signal level detector 216, a voltage-to-current amplifier 218 and a capacitor 220. The signal level detector 216 detects the level of the modulated IF signal provided by the single sideband mixer 212. The detected signal level is provided to a first input 238 of the amplifier 218. The difference between the detected signal level and a DC reference level, designated $V_{ref}$, received at a second input 240 of the amplifier 218 produces an error current which is supplied to the capacitor 220. The capacitor 220 is coupled to the gain control input 222 of the input amplifier 202. Thus, the AGC circuit 214 controls the gain of the input amplifier 202.

This type of AGC circuit is a feedback loop containing the first filter 228 and the second filter 230. In this circuit, the bandwidth of the AGC circuit 214 is limited to approximately 1/40th of the IF modulation bandwidth (or approximately 1/20th the baseband width). The acquisition time for the receive signal for this receiver 200, also designated the receiver attack time is approximately $$t_{acq} = (44/\pi)/BW_{IF}$$
$$= (44/\pi)T_{sym} = 14T_{sym}$$

Where $BW_{IF}$ is the IF modulation bandwidth and $T_{sym}$ is the symbol period (approximately $1/BW_{IF}$). As one example, a radio receiver such as receiver 200 for use with the Digital European Cordless Telephone (DECT) standard employs gaussian frequency shift keying (GFSK) and has a modulation bandwidth of 1.152 MHz, yielding a minimum receiver attack time of 12 microseconds. This relation neglects the added delays associated with the baseband filters and the detector circuit. This long receiver attack time is a substantial limitation in the operation of the receiver 200, particularly when used in conjunction with time division, multiple access (TDMA) protocols such as DECT, PHS (Personal Handy Phone System, used in Japan) or digital cellular systems.

Figure 3:
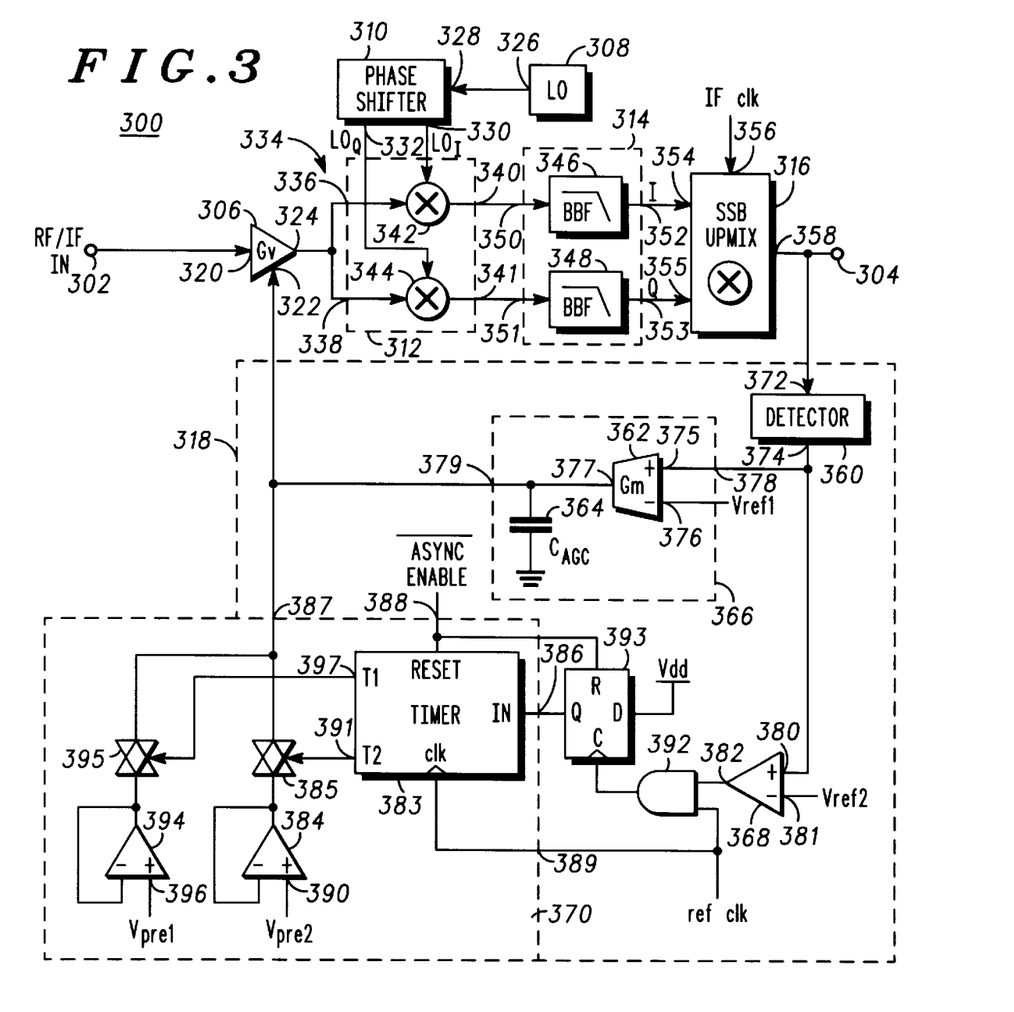
FIG. 3 is an illustration in block diagram for of a first embodiment of a radio receiver according to the present invention which may be used in the radiotelephone handset of FIG. 1.

Referring now to FIG. 3, it shows an illustration in block diagram form of a first embodiment of a radio receiver 300 according to the present invention which may be used in radiotelephone handset 104 of FIG. 1. The receiver 300 has a receiver input 302 and a receiver output 304. The receiver 300 includes an input amplifier 306, a local oscillator 308, a phase shifter 310, a first mixer circuit 312, a filter circuit 314, a single sideband mixer 316 and an automatic gain control circuit 318. Receiver 300 is preferably fabricated on a single monolithic integrated circuit (not shown).

The receiver input 302 is configured to be coupled to an antenna such as antenna 106 of the radiotelephone handset 104 (FIG. 1). The input amplifier 306 has an input 320 coupled to the receiver input 302, a gain control input 322 and an output 324. The input amplifier 306 is a variable gain amplifier, amplifying RF signals received at the input 302 in response to a gain control signal received at the gain control input 322. That is, the ratio of the amplitude of the signals received at the input 302 to the amplitude of the signals provided at the output 324 is set by the amplifier 306 in response to the gain control signal received at the gain control input 322. The amplifier 306 provides the amplified signals to the output 324.

The local oscillator 308 provides an analog oscillating signal at an output 326. The frequency of the oscillating signal is tuned to a predetermined frequency associated with one of the channels defined by the telecommunications protocol which controls operation of the radiotelephone communication system 100. The frequency of the oscillating signal may be controlled external to the local oscillator 308, for example, by the controller 114 (FIG. 1). The phase shifter 310 has an input 328 for receiving the oscillating signal from the output 326 of the local oscillator 308. The phase shifter 310 has a first output 330 for providing an in-phase signal and a second output 332 for providing a quadrature signal. The in-phase signal provided at the output 330 has substantially the same frequency and phase as the oscillating signal provided at the output 326 of the local oscillator 308. The quadrature signal provided at the output 332 has the same frequency as the in-phase frequency provided at the output 330. However, the quadrature signal is −90° out of phase with respect to the in-phase signal.

The first mixer circuit 312 has an input 334 including a first input 336 and a second input 338, each coupled to the output 324 of the input amplifier 306. The first mixer circuit 312 further includes a first output 340 and a second output 341. The first mixer circuit 312 includes a first mixer 342 and a second mixer 344. The first mixer 342 is coupled to the first input 336 and the first output 330 of the phase shifter 310. The second mixer 344 is coupled to the second input 338 of the mixer circuit 312 and the second output 332 of the phase shifter 310. Thus, the first mixer 342 mixes the amplified signal provided by the input amplifier 306 with the in-phase signal provided by the phase shifter 310, and the second mixer 344 mixes the amplified signal provided by the input amplifier 306 with the quadrature signal provided by the phase shifter 310. Output signals from the first mixer 342 are provided to the first output 340 and output signals from the second mixer 344 are provided to the second output 341 of the first mixer circuit 312.

The filter circuit 314 includes a first filter 346 and a second filter 348. The filter circuit 314 further includes a first input 350 and a second input 351 and a first output 352 and a second output 353. The first input 350 is coupled to the first output 340 of the first mixer circuit 312 and the second input 351 is coupled to the second output 341 of the first mixer circuit 312. The first filter 346 filters signals received from the first mixer 342 and is preferably a low pass base band filter. The second filter 348 filters signals received from the second mixer 344 and is preferably a low pass base band filter. The filter circuit 314 provides filtered signals to the single sideband mixer 316.

The single sideband mixer 316 has a first input 354 coupled to the first output 352 of the filter circuit 314, a second input 355 coupled to the second output 353 of the filter circuit 314, a clock input 356 and an output 358. The cloak input 356 is configured to be coupled to a source of clock signals, such as controller 114 (FIG. 1). In response to clock signals received at the clock input 356, the single sideband mixer 316 modulates the in-phase and quadrature signals received at the first input 354 and second input 355 up to a moderate IF frequency, such as 1 MHz, for IF demodulation. The modulated signals are provided to the receiver output 304, which is configured for coupling to a demodulator such as demodulator 112 (FIG. 1) in a radiotelephone handset.

The input amplifier 306, the local oscillator 308, the phase shifter 310, the first mixer circuit 312, the filter circuit 314 and the single sideband mixer 316 together perform the functions of a homodyne or zero intermediate frequency receiver as is well-known in the art. In order that the RF signals received at the receiver input 302 do not overdrive the baseband selectivity filters, filter 346 and filter 348, the gain of the input amplifier 306 must be regulated. That is, for proper operation of the first filter 346 and the second filter 348, these filters must be operated in their respective linear operating range.

The automatic gain control circuit 318 controls the gain of the input amplifier 306 in response to the level of the signal provided at the output 358 of the single sideband mixer 316. The automatic gain control (AGC) circuit 318 includes a signal level detector 360, an amplifier circuit or integrator 366 including an amplifier 362 and an automatic gain control capacitor 364, a comparator 368 and a timer circuit 370.

The signal level detector has an input 372 coupled to the output 358 of the single sideband mixer 316 and an output 374. The signal level detector 360 detects the level of the modulated IF signal provided at the output 358. The signal level detector 360 may be, for example, an envelope detector such as a full-wave rectifier. Such envelope detectors are well-known in the art.

The amplifier 362 has a first input 375 coupled to the output 374 of the signal level detector 360, a second input 376 configured to receive a DC reference level identified as $V_{ref1}$ in FIG. 3 and an output 377. $V_{ref1}$ operates as a predetermined threshold voltage for the amplifier 362. The output 377 is coupled to the gain control input 322 of the input amplifier 306. The capacitor 364 is coupled between the output 377 of the amplifier 362 and ground potential.

The amplifier 362 detects the difference between the signal level provided at the output 374 of the signal level detector 360 and the predetermined threshold provided at the input 376 of the amplifier 362. In response to this difference, the amplifier 362 applies a charging signal to the automatic gain control capacitor, capacitor 364. The charging signal is an error signal which has the form of a current which charges the capacitor 364. Thus, the amplifier 362 and the capacitor 364 operate as an integrator 366, the integrator 366 having an input 378 and an output 379.

When the signal level detected by the signal level detector 360 exceeds the threshold established by the DC reference signal $V_{ref1}$, the amplifier 362 charges the capacitor 364, increasing the potential across the capacitor 364. This increase in potential, applied to the gain control input 322 of the input amplifier 306 causes the input amplifier 306 to reduce the gain of the input amplifier 306, reducing amplification of RF signals received at the input 320 and provided to the mixer circuit 312. Similarly, when the signal level detected by the signal level detector 360 is below the threshold established by the DC reference signal $V_{ref1}$, the amplifier 362 does not charge the capacitor 364 and the capacitor 364 is allowed to discharge through ground potential. This causes the potential across the capacitor 364 to decrease, this potential being applied to the gain control input 322 of the input amplifier 306. The decreasing potential at the gain control input 322 causes the input amplifier 306 to increase the amplification of RF signals received at the input 320 and provided to the first mixer circuit 312. Thus, the signal level detector 360 and the integrator 366 provide an analog automatic gain control function.

The comparator 368 has a first input 380 coupled to the output 374 of the signal level detector 360, a second input 381 configured to receive a DC reference signal identified as $V_{ref2}$ in FIG. 3 and an output 382. When the output signal from the signal level detector 360 exceeds the predetermined threshold established by the DC reference level provided to the input 381, the comparator 368 provides a trigger signal at the output 382.

The timer circuit 370 includes a timer 383, a buffer 384, a transmission gate 385, a buffer 394 and a transmission gate 395. The timer circuit 370 further includes an input 386 and an output 387. The input 386 is coupled to the output 382 of the comparator 368 for receiving the trigger signal from the comparator 368. The output 387 is coupled to the capacitor 364 and the gain control input 322 of the input amplifier 306. The timer circuit further includes a reset input 388 and a clock input 389. The reset input 388 and the clock input 389 may be coupled to the controller 114 of the radiotelephone handset 104 (FIG. 1). These signals may also be provided by any suitable controller of a radio in which the receiver 300 is implemented. The timer 383 is preferably configured to provide a timing pulse in the form of a voltage pulse or current pulse having a predetermined time duration. The design details of a timer such as timer 383 are readily understood by those ordinarily skilled in the art of digital circuit design.

The buffer 384 and the buffer 394 are preferably configured in a unity gain configuration, as shown in FIG. 3. In the unity gain configuration, voltage signals provided at the outputs of the buffers 384, 394 are substantially identical to signals received at the input of the buffer 384, 394. The buffer 384 has an input 390 configured to receive a signal identified in FIG. 3 as $V_{pre2}$ and an output coupled to one end of the transmission gate 385. The other end of the transmission gate 385 is coupled to the output 387 of the timer circuit 370. The transmission gate 385 is controlled by the timing signal (T2) received at an output 391 of the timer 383. The buffer 394 has an input 396 configured to receive a signal identified in FIG. 3 as $V_{pre1}$, and an output coupled to one end of the transmission gate 395. The other end of the transmission gate 395 is coupled to the output 387 of the timer circuit 370. The transmission gate 395 is controlled by the timing signal T1 received from output 397 of the timer 383. The transmission gates 385, 395 are preferably CMOS transmission gates of the type well-known in the art.

The buffer 384 preferably amplifies the signal received at the input 390 to provide sufficient current drive to rapidly charge the capacitor 364 when the transmission gate 385 is switched to its low impedance state in response to the timing pulse provided at the output 391 of the timer 383. If the timer 383 is designed so that the output 391 can provide sufficient current drive to rapidly charge the capacitor 364, the buffer 384 and the transmission gate 385 may be eliminated.

Similarly, the buffer 394 preferably amplifies the signal received at the input 396 to provide sufficient current drive to rapidly charge the capacitor 364 when the transmission gate 395 is switched to its low impedance state in response to the timing pulse provided at the output 397 of the timer 383. If the timer 383 is designed so that the output 397 can provide sufficient current drive to rapidly charge the capacitor 364, the buffer 394 and the transmission gate 395 may be eliminated.

The buffer 394 charges the capacitor 364 to the voltage provided at the output of the buffer 394, which is equal to the voltage provided at the input of the buffer 394, $V_{pre1}$, if the buffer 394 is in the unity gain configuration. The buffer 394 provides a voltage pulse or current pulse as an initial preset control signal for the input amplifier. This initial gain control preset of the input amplifier 306 would be performed at the beginning of the active receive time period. Typically, this level would place the input amplifier 306 in its maximum gain level setting. This insures the best chance of receiving weak, distant or noisy signals. Thus for this initial configuration, the T1 timing signal at the output 397 of the timer 383 would be at the level required to place the transmission gate 395 in its low impedance state. During this period of operation, the T2 timing signal at the output 391 of timer 383 is at the required level to place the transmission gate 385 in its high impedance state. The buffer 384 charges the capacitor 364 to the voltage provided at the output of the buffer 384, which is equal to the voltage provided at the input of the buffer 384, $V_{pre2}$, if the buffer 384 is in the unity gain configuration. By charging the capacitor to $V_{pre2}$, the buffer 384 generates a precharge pulse to reduce the gain of the input amplifier 306 to a preset level. The buffer 384 provides a predetermined voltage to the gain control input 322 of the input amplifier 306. In this manner, the automatic gain control circuit 318 reduces the gain of the input amplifier 306 to a preset level defined by the voltage at the output of the buffer 384.

The automatic gain control circuit 318 further preferably includes an AND gate 392 and a flip-flop 393. The AND gate 392 operates to synchronize timing of the trigger pulse provided at the output 382 of the comparator 368 with a reference clock signal received by the automatic gain control circuit 318 at the input 389. The flip-flop 393 permits resetting of the automatic gain control circuit 318 in response to the control signal received from the controller 114 (FIG. 1).

In operation, the comparator 368 and the timer circuit 370 operate to perform a one-bit coarse digital gain adjustment initially. This initial adjustment is followed by fine gain regulation defined by the analog automatic gain control circuit formed by the detector 360 and the integrator 366.

Upon receipt of a signal, the signal level detector 360 detects the level of the signal, for example, by detecting the envelope of the received signal. The output signal from the signal level detector is provided to the comparator 368. If the output signal exceeds the reference voltage received at the input 381, the comparator 368 provides a trigger pulse at the output 382. On the next edge of the reference clock, the trigger pulse will be provided to the timer 383. In response to the trigger pulse, the timer 383 changes the level of the timing signal T1 at the output 397 so that the transmission gate 395 is placed in its high impedance state. Also, the timer 383 changes the level of the timing signal T2 at the output 391 so that the transmission gate 385 is placed in its low impedance state. This couples the $V_{pre2}$, output from buffer 384 to the gain control input 322 of input amplifier 306, providing a timing pulse at the output 391. The timing pulse has a predetermined duration sufficient to charge the capacitor 364 to a predetermined voltage determined by the buffer 384. The appropriate timing pulse duration, capacitance value for the capacitor 364 and output voltage provided by the buffer 384 may be readily determined by those ordinarily skilled in the art of circuit design. In response to this predetermined voltage, the input amplifier 306 reduces the amplification of the amplifier 306 to a preset level. Thereafter, the more slowly responding analog automatic gain control circuit including the detector 360 and the integrator 366 adjusts the amplification of the amplifier 306 to an amplification which causes the detected signal level at the output 374 of the detector 360 to equal the predetermined voltage $V_{ref1}$ at the input 376 of amplifier 362 which is part of the integrator 366.

Figure 4:
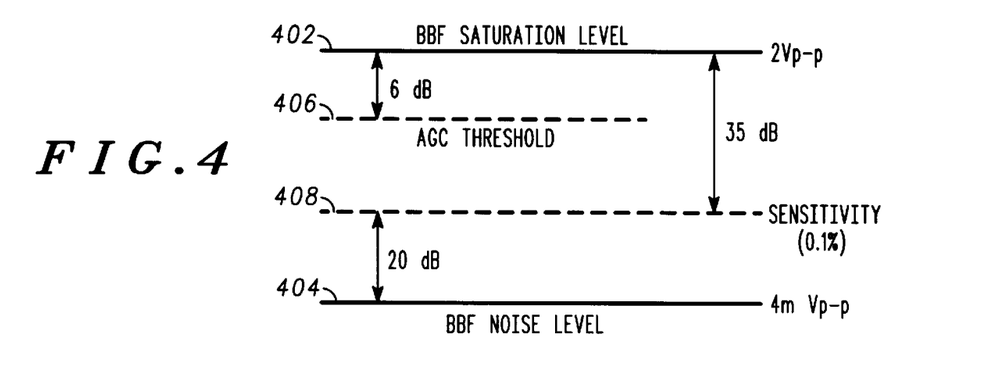
FIG. 4 is an illustration showing automatic gain control regulation level relative to receiver dynamic range or the receiver of FIG. 3.

FIG. 4 illustrates automatic gain control circuit regulation level relative to receiver dynamic range for the receiver 300 of FIG. 3. FIG. 4 illustrates typical levels for circuit components which may be used to form the receiver 300.

In FIG. 4, the saturation level 402 of the baseband filters, filter 346 and filter 348 in FIG. 3, is illustrated at $2V_{P-P}$. This is the maximum signal level for an input signal received at the first input 350 and the second input 351 of the filter circuit 314 which will keep the filter 346 and the filter 348 in the linear region of operation. Above the baseband filter saturation level, the filter 346 and the filter 348 will be saturated.

Similarly, FIG. 4 illustrates a minimum noise level 404 for the baseband filters, filter 346 and filter 348. This value is typically 4 $mV_{P-P}$. This represents the minimum signal level which may be received at the first input 350 or the second input 351 of the filter circuit 314 to produce an output signal at the first output 352 or the second output 353 of the filter circuit 314. The difference between the saturation level 402 and the noise level 404 represents the linear operating range of the filter circuit 314 and is approximately equal to a signal-to-noise ratio of 55 dB.

Further illustrated in FIG. 4 is the threshold level 406 of the automatic gain control circuit 318, preferably set 6 dB below the saturation level 402, corresponding to $1_{VP-P}$. Further shown in FIG. 4 is a received sensitivity level 408 which is set at 20 dB above the noise level 404, corresponding to a signal-to-noise ratio of 20 dB and received bit error rate (BER) of less than 0.1% for a typical digital receiver.

Preferably, the DC reference level identified as $V_{ref2}$ and provided to the input 381 of the comparator 368 is set to the baseband filter saturation level 402. With this threshold level, the comparator 368 will provide the trigger pulse at the output 382 for input levels exceeding the linear dynamic range of the receiver 300. In response to the trigger signal, the timer circuit 370 provides a timing pulse having a predetermined duration long enough to permit charging of capacitor 364 by the buffer 384 to the level $V_{pre2}$. Preferably, the reference level $V_{pre2}$ is established at a voltage level which provides a gain reduction of the input amplifier 306 which maximizes the dynamic range of the receiver 300. The reference level $V_{pre2}$ may be controllable by the controller 114 (FIG. 1) using additional circuitry such as a digital to analog converter.

As an example, for an input signal dynamic range of 70 dB, the available receiver dynamic range of 35 dB in FIG. 4 spans one-half this value. Thus, a $V_{pre2}$ voltage corresponding to a 35 dB reduction in gain of the input amplifier 306 extends the receiver dynamic range over the entire input signal range. This significantly reduces the input signal acquisition time, since the analog AGC circuit formed by the detector 360 and the integrator 366 is now operating within the linear range of the first filter 346 and the second filter 348. Assuming that proper demodulation occurs once the baseband signal is below the saturation level of the baseband filters, filter 346 and filter 348, the input signal acquisition time is now dependent only on the delay time of the baseband filters, filter 346 and filter 348, and the signal level detector 360, combined with the duration of the timing pulse provided by the timing circuit 370. This signal acquisition time is approximately 2–3 $T_{sym}$ For systems which have an available linear dynamic range of 30 dB and an input signal dynamic range of 80 dB, a $V_{pre2}$ voltage which sets a 40 dB gain reduction will place the baseband signal no more than 10 dB outside the baseband filter's dynamic range. This will still yield a significant reduction in the worst case acquisition time.

Figure 5:
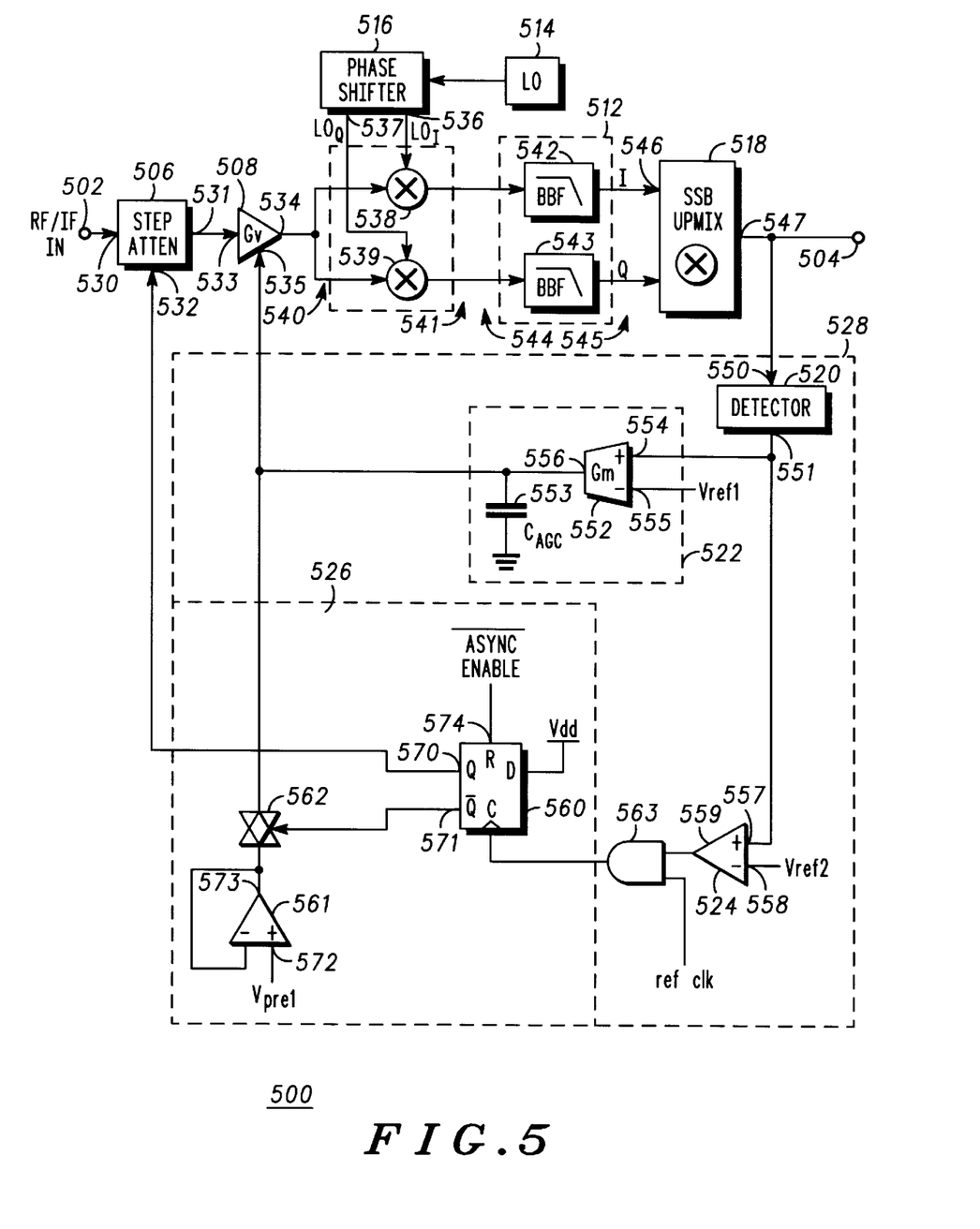
FIG. 5 is an illustration in block diagram form of a second embodiment of a radio receiver according to the present invention which may be used in the radiotelephone handset of FIG. 1.

FIG. 5 is an illustration in block diagram form of a second embodiment of a radio receiver 500 according to the present invention which may be used in the radiotelephone handset 104 of FIG. 1. The receiver 500 has a receiver input 502 and a receiver output 504. The receiver 500 includes a step attenuator 506, an input amplifier 508, a mixer circuit 510, a filter circuit 512, a local oscillator 514, a phase shifter 516, a single sideband mixer 518 and an automatic gain control circuit 528. The automatic gain control circuit 528 includes a signal level detector 520, an amplifier circuit in the form of an integrator 522, a comparator 524 and a timing circuit 526. Radio receiver 500 is preferably fabricated on a single monolithic integrated circuit (not shown).

The step attenuator 506 has an input 530 coupled to the receiver input 502, an output 531 and a control input 532. Preferably, the step attenuator provides two or more levels of attenuation selected by a control signal applied to the control input 532. For example, one level attenuation might be no attenuation at all, and a second level of attenuation might be 30 dB of attenuation. Selection between the first level of attenuation and the second level of attenuation would be provided by a binary control signal applied to the control input 532. Other levels of attenuation may be chosen as appropriate and the design details of the step attenuator 506 are well within the purview of one ordinarily skilled in the art of radio receiver design. The step attenuator 506 provides attenuated RF signals to the input amplifier 508.

The input amplifier 508 has an input 533 coupled to the output 531 of the step attenuator 506, an output 534 and a gain control input 535. The input amplifier 508 is a variable gain amplifier, amplifying signals received at the input 533 in response to a gain control signal received at the gain control input 535 and provides the amplified signals to the output 534. Amplification of signals by the input amplifier 508 may actually be attenuation of those signals.

The local oscillator 514 provides an oscillating signal at a frequency corresponding to the frequency of modulation of the RF signals received at the receiver input 502. This oscillating signal is provided to the phase shifter 516. The phase shifter 516 has a first output 536 for providing an in-phase signal having substantially the same frequency and phase as the signal received from the local oscillator 514 and a second output 537 for providing a quadrature signal having substantially the same frequency as the signal received from the local oscillator 514, but being 90° out of phase from the signal received from the local oscillator. The in-phase and quadrature signals are provided to the mixer circuit 510.

The mixer circuit 510 includes a first mixer 538 and a second mixer 539. The mixer circuit 510 further includes an input 540 coupled to the output 534 of the input amplifier 508 and an output 541. The first mixer 538 receives the in-phase signal from the first output 536 of the phase shifter 516 and the amplified RF signals from the output 534 of the input amplifier 508. The second mixer 539 receives the quadrature signal from the output 537 of the phase shifter 516 and the amplified RF signals from the output 534 of the input amplifier 508. The output signal from the first mixer 538 and the output signal from the second mixer 539 are provided to the output 541 of the mixer circuit 510.

The filter circuit 512 includes a first filter 542 and a second filter 543. The filter circuit 512 also includes an input 544 and an output 545. The first filter 542 is preferably a lowpass baseband filter (BBF) which filters signals received from the first mixer 538. Similarly, the second filter 543 is preferably a lowpass filter (BBF) which filters signals received from the second mixer 539. The filter circuit 512 provides filtered signals to the single sideband mixer 518.

The single sideband mixer 518 has an input 546 coupled to the output 545 of the filter circuit 512. The single sideband mixer 518 receives an in-phase signal from the first filter 542 and a quadrature signal from the second filter 543. The single sideband mixer 518 modulates the on-channel in-phase and quadrature signals up to a moderate IF frequency, such as 1 MHz for IF demodulation. The single sideband mixer 518 includes an output 547 for providing demodulated IF signals to the receiver output 504.

The receiver output 504 is configured to be coupled to a demodulator such as the demodulator 112 of the radiotelephone handset 104 (FIG. 1). The step attenuator 506, the input amplifier 508, the local oscillator 514, the phase shifter 516, the mixer circuit 510, the filter circuit 512 and the single sideband mixer 518 form a homodyne or zero intermediate frequency receiver of the type well-known in the art.

The automatic gain control circuit 528 operates to control the gain of the input amplifier 508 and the attenuation level of the step attenuator 506 to prevent saturation of the first filter 542 or the second filter 543. The automatic gain control circuit 528 detects signal levels sufficient to cause saturation of either the first filter 542 or the second filter 543 and varies the gain of the input amplifier 508 and the attenuation level of the step attenuator 506, or both, to return the filter to the linear mode of operation.

The signal level detector 520 has an input 550 and an output 551. The signal level detector 520 detects the maximum value of the modulated RF signal at the output 547 of the single sideband mixer 518. The signal level detector 520 is preferably an envelope detector such as a full-wave rectifier but may be any other suitable signal level detector. The signal level detector 520 provides an output signal indicative of the signal level of the RF signals received at the receiver input 502 to the output 551.

The integrator 522 includes an amplifier 552 and an automatic gain control capacitor 553. The amplifier has a first input coupled to the output 551 of the signal level detector 520. The amplifier 552 further includes a second input 555 configured to receive a reference level identified in FIG. 5 as $V_{ref1}$. The amplifier 552 has an output 556 coupled to the gain control input 535 of the input amplifier 508. The capacitor 553 is coupled between the output 556 of the amplifier 552 and ground potential.

The integrator 522 controls the gain of the input amplifier 508 to prevent saturation of the first filter 542 and the second filter 543 in a manner substantially identical to operation of the integrator 366 described above in conjunction with FIG. 3. Thus, the signal level detector 520 and the integrator 522 operate to form an analog automatic gain control circuit which provides relatively fine, precise regulation of the gain of the input amplifier 508.

While the operation of the analog automatic gain control circuit is precise, the operation is relatively slow in relation to rapidly changing input signal levels. Therefore, in accordance with the present invention, the automatic gain control circuit 528 further includes the comparator 524 and the timing circuit 526 which provide relatively rapid attenuation of input signal levels to prevent or limit saturation of the baseband filters, filter 542 and filter 543.

The comparator 524 has a first input 557 coupled to the output 551 of the signal level detector 520. The comparator 524 further includes a second input 558 configured to receive a threshold level designated in FIG. 3 as $V_{ref2}$. The comparator 524 still further includes an output 559.

The timing circuit includes a flip-flop 560, a buffer 561 and a transmission gate 562. The flip-flop 560 has a clock input coupled to the output 559 of the comparator 524. The flip-flop has a true output 570 coupled to the control input 532 of the step attenuator 506. The flip-flop 560 further has an inverting output 571 coupled to the control input of the transmission gate 562. The flip-flop 560 still further includes a reset input 574 which is configured for receiving a reset signal from any appropriate source, such as controller 114 of radiotelephone handset 104 (FIG. 1).

The buffer 561 has an input 572 configured to receive a reference voltage labeled $V_{pre1}$ in FIG. 5 and an output 573. The output 573 of the buffer 561 is coupled to one side of the transmission gate 562, and the other side of the transmission gate 567 is coupled to the capacitor 553 and the gain control input 535 of the input amplifier 508. A logic "high" for the output signal 571 from flip-flop 560 places the transmission gate 562 in its low impedance state. This couples the output 573 of buffer 561 to the gain control input 535 of the input amplifier 508 For this case, the signal at the output 570 of the flip flop 560 will be a logic "low." A logic "low" at the input 532 of the step attenuator 506 preferably places the attenuator in a 0 dB or "no" attenuation mode of operation. This configuration would be used at the start of the active receive mode and it would typically place the receiver in a maximum gain setting for maximum receive sensitivity.

The comparator 524 compares the output signal from the signal level detector 520 with the reference level received at the second input 558 of the comparator 524. When the output signal of the signal level detector 520 exceeds this reference level, the comparator 524 provides a trigger pulse to the timing circuit 526. As is illustrated in FIG. 5, preferably the timing pulse provided at the output 559 of the comparator 524 is gated by an AND gate 563 which receives a reference clock signal. The reference clock signal may be provided by the controller 114 which controls operation of the radiotelephone handset 104 (FIG. 1).

In response to the trigger signal received at the clock input, the flip-flop 560 provides a control signal to the transmission gate 562 to switch the transmission gate 562 to its high impedance state. In this state, the buffer 561 is no longer coupled to the gain control input 535 of input amplifier 508.

Also, when the timing circuit 526 receives the trigger pulse from the comparator 524, the flip-flop 560 provides an attenuation timing pulse to the control input 532 of the step attenuator 506. In response to this attenuation timing pulse, the step attenuator rapidly attenuates the signal provided at the output 531 in response to RF signals received at the input 530. In this manner, the RF signals received at the receiver input 502, which are sufficient to saturate the first filter 542 and the second filter 543 are rapidly attenuated to a signal level within the linear operating range of the filters, filter 542 and filter 543.

Use of the step attenuator 506 as illustrated in FIG. 5 provides an added advantage in that the RF signal received at the receiver input 502 is attenuated prior to the input amplifier 508. It is desirable to attenuate large amplitude signals promptly when received in a circuit in order to prevent coupling of the large amplitude signals to an output node such as the receiver output 504. Coupling can occur through device parasitics, such as the substrate on which the integrated circuit embodying the receiver 500 is constructed.

As can be seen from the foregoing, the present invention provides an apparatus and method for improving the response time of an automatic gain control circuit for use in a radio receiver, a radio receiver employing such a circuit, and a radiotelephone handset employing such a receiver. Received signal acquisition time is the primary drawback to using a zero IF receiver in many radio products, including time division multiple access (TDMA) radio products. The present invention utilizes an asynchronous digital automatic gain control circuit to perform a single (coarse) gain adjustment so that the time required for the remaining analog gain regulation is greatly reduced. This yields a substantial reduction in the input signal acquisition time, that is, the receiver attack time.

While a particular embodiment of the particular embodiment of the present invention has been shown and described, modifications may be made. For example, the buffer circuits employed to provide current drive to the automatic gain control circuit capacitors may be eliminated in favor of other circuits capable of providing sufficient current drive. Similarly, the control signals which provide clocking and resetting functions may be eliminated or may be provided by any suitable control source. Other logic components similar to the AND gate 563 in FIG. 5, the AND gate 392 in FIG. 3, or the flip-flop 393 in FIG. 3 may be included as required to provide proper control of the receiver circuits. It is therefore intended in the appended claims to cover all such changes and modifications which fall within the true spirit and scope of the invention.

What is claimed is:

1. A method for controlling gain of an amplifier in a radio receiver, the amplifier including a gain control input, the radio receiver including an automatic gain control capacitor and configured for coupling to an antenna, the method comprising the steps of:

detecting radio frequency (RF) signals at the antenna, producing detected RF signals;

filtering the detected RF signals in a filter circuit, producing filtered signals;

detecting a signal level of the filtered signals;

when the signal level of the filtered signals exceeds a predetermined threshold, generating a timing pulse having a predetermined duration;

applying a precharge pulse to the automatic gain control capacitor to charge the automatic gain control capacitor to a predetermined voltage;

applying the predetermined voltage to the gain control input;

applying the precharge pulse to the gain control input during the predetermined duration of the timing pulse to reduce the gain of the amplifier to a preset level; and thereafter, adjusting the gain of the amplifier to a gain which prevents saturation of the filter circuit.

2. A method as recited in claim 1 wherein the reducing step comprises the steps of:

comparing the signal level to a second predetermined threshold;

applying a charging signal to the automatic gain control capacitor when the signal level exceeds the second predetermined threshold; and interrupting the charging signal when the signal level does not exceed the second predetermined threshold to permit discharge of the automatic gain control capacitor.

3. A receiver for receiving radio frequency (RF) signals, the receiver comprising:

a receiver input and a receiver output;

an input amplifier having an input coupled to the receiver input, an output and a gain control input;

a first mixer circuit having an input coupled to the output of the input amplifier and an output;

a filter circuit having an input coupled to the output of the first mixer circuit and an output;

a single sideband mixer having an input coupled to the output of the filter circuit and an output coupled to the receiver output;

an automatic gain control circuit including:

a signal level detector having an input coupled to the output of the single sideband mixer and an output;

an integrator having an input coupled to the output of the signal level detector and an output coupled to the gain control input of the input amplifier;

a comparator having a first input coupled to the output of the signal level detector, a second input for receiving a reference level and an output; and a timer circuit having an input coupled to the output of the comparator and an output coupled to the output of the integrator, the timer circuit providing to the output of the integrator a voltage pulse having a predetermined time duration in response to a trigger signal received from the output of the comparator.

4. A receiver as defined in claim 3 wherein the integrator comprises an amplifier having a first input coupled to the output of the signal level detector, a second input configured to receive a reference voltage and an output coupled to the gain control input of the input amplifier for providing an error signal, and a capacitor coupled to the output of the amplifier, the capacitor being charged in response to the error signal and in response to the voltage pulse.

5. A receiver as defined in claim 4 wherein the voltage pulse charges the capacitor to a predetermined voltage.

6. A receiver as defined in claim 5 wherein the input amplifier amplifies signals received at the input of the input amplifier in response to a gain control signal received at the gain control input, and wherein the timer circuit provides the voltage pulse as an initial preset control signal and the amplifier provides the error signal to establish final gain resolution following the predetermined time duration.

7. A receiver as defined in claim 3 wherein the comparator receives from the signal level detector a signal level signal, the signal level signal being representative of input signal level of the RF signals and wherein the comparator provides the trigger signal when the signal level signal exceeds a predetermined threshold.

8. A receiver as defined in claim 7 wherein the comparator provides the trigger signal when the input signal level exceeds a linear dynamic range of the receiver.

9. A receiver as defined in claim 8 wherein the linear dynamic range of the receiver corresponds to saturation of the filter circuit.

10. A receiver as defined in claim 3 further comprising a step attenuator coupled between the receiver input and the input amplifier, the step attenuator having a control input coupled to the timer circuit, wherein the timer circuit provides to the control input an attenuation timing pulse in response to the trigger signal, and wherein, in response to the attenuation timing pulse, the step attenuator attenuates RF signals received at the receiver input and provides attenuated RF signals to the input of the input amplifier.

11. An automatic gain control circuit for a radio receiver, the radio receiver including a receiver input for receiving radio frequency (RF) signals and a receiver output, the radio receiver further including a variable gain amplifier having an input coupled to the receiver input, an output and a gain control input, the variable gain amplifier amplifying the RF signals in response to a gain control signal received at the gain control input and providing amplified signals at the output of the variable gain amplifier, the radio receiver further including a filter coupled to the output of the variable gain amplifier for filtering the amplified signals and providing filtered signals to the output of the radio receiver, the automatic gain control circuit comprising:

a signal level detector coupled to the receiver output for detecting a signal level of the filtered signals and providing a signal level signal, the signal level signal being indicative of the signal level;

an amplifier circuit having an input coupled to the signal level detector and an output coupled to the gain control input, the amplifier circuit providing the gain control signal in response to the signal level signal, the amplifier circuit including a capacitor coupled to the output of the amplifier circuit; and a timer circuit providing a precharge pulse to the gain control input when the signal level signal exceeds a predetermined threshold, the precharge pulse charging the capacitor to a predetermined voltage, the predetermined voltage being applied to the gain control input to establish the gain control signal.

12. An automatic gain control circuit as recited in claim 11 wherein the amplifier circuit further includes an amplifier having a first input coupled to the signal level detector, a second input for receiving a threshold voltage and an output coupled to the capacitor, and wherein, after the timer circuit provides the precharge pulse, the amplifier circuit establishes a charge on the capacitor in response to the signal level signal to establish the gain control signal.

13. An automatic gain control circuit as recited in claim 11 wherein the timer circuit includes a timer for providing a timing pulse having a predetermined time duration, a buffer for providing the precharge pulse and a switch coupled between the buffer and the gain control input, the switch having a control input coupled to the timer, the switch selectively coupling the buffer to the gain control input in response to the timing pulse.

14. An automatic gain control circuit as recited in claim 13 wherein the timer circuit further includes a comparator having a first input coupled to the signal level detector, a second input configured for receiving a reference level and an output coupled to the timer, the comparator providing a trigger signal to the timer when the signal level signal of the signal level detector exceeds the reference level, the timer providing the timing pulse in response to the trigger signal.

15. A radiotelephone comprising:
   an antenna;
   a transmitter coupled to the antenna;
   a control circuit coupled to the transmitter for controlling operation of the radiotelephone;
   a receiver coupled to the control circuit, the receiver including:
      a receiver input coupled to the antenna for receiving radio frequency (RF) signals from the antenna and a receiver output coupled to the control circuit;
      an amplifier having an input coupled to the receiver input, an output and a gain control input;
      a first mixer circuit having an input coupled to the output of the amplifier and an output;
      a filter circuit having an input coupled to the output of the first mixer circuit and an output;
      a single sideband mixer having an input coupled to the output of the filter circuit and an output coupled to the receiver output;
      an automatic gain control circuit including:
         a signal level detector having an input coupled to the receiver output and an output;
         an integrator having an input coupled to the output of the signal level detector and an output coupled to the gain control input of the amplifier;
         a comparator having a first input coupled to the output of the signal level detector, a second input for receiving a reference level and an output; and
         a timer circuit having an input coupled to the output of the comparator and an output coupled to the gain control input, the timer circuit providing to the gain control input a voltage pulse having a predetermined time duration in response to a trigger signal received from the output of the comparator.

16. A radiotelephone as recited in claim 15 wherein the integrator comprises a capacitor coupled to the gain control input of the amplifier and a feedback amplifier having an input coupled to the output of the signal level detector and an output coupled to the capacitor, and wherein the signal level detector provides a signal level signal indicative of a signal level of the RF signals, the feedback amplifier charging the capacitor when the signal level signal exceeds a second reference level.

17. A radiotelephone as recited in claim 16 wherein the timer circuit provides the voltage pulse to the capacitor to precharge the capacitor to a predetermined voltage.

* * * * *